United States Patent
Subrahmanyam et al.

(10) Patent No.: US 12,543,567 B2
(45) Date of Patent: Feb. 3, 2026

(54) TUNABLE STACK-UP DIMM FORM FACTOR COLD PLATE WITH EMBEDDED PELTIER DEVICES FOR ENHANCED COOLING CAPABILITY

(71) Applicant: Intel Corporation, Santa Clara, CA (US)

(72) Inventors: Prabhakar Subrahmanyam, San Jose, CA (US); Yi Xia, Campbell, CA (US); Ying-Feng Pang, San Jose, CA (US); Ridvan A. Sahan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 17/525,661

(22) Filed: Nov. 12, 2021

(65) Prior Publication Data

US 2022/0077023 A1    Mar. 10, 2022

(51) Int. Cl.
*H01L 23/38* (2006.01)
*H01L 23/00* (2006.01)
*H01L 23/42* (2006.01)

(52) U.S. Cl.
CPC .............. *H01L 23/38* (2013.01); *H01L 23/42* (2013.01); *H01L 24/32* (2013.01); *H01L 2224/32245* (2013.01)

(58) Field of Classification Search
CPC ......... H01L 23/38; H01L 23/42; H01L 24/32; H01L 2224/32245; H05K 7/20772; H05K 7/20254; H05K 7/20509
USPC ....................................................... 361/679.49
See application file for complete search history.

(56) References Cited

U.S. PATENT DOCUMENTS

| | | | |
|---|---|---|---|
| 10,499,488 B1* | 12/2019 | Tsai | H05K 1/144 |
| 2012/0057300 A1* | 3/2012 | Tan | H01L 23/467 |
| | | | 361/697 |
| 2013/0194745 A1* | 8/2013 | Meijer | G06F 1/20 |
| | | | 361/679.47 |
| 2016/0093553 A1* | 3/2016 | Prakash | H01L 23/38 |
| | | | 361/717 |
| 2020/0159294 A1* | 5/2020 | Franz | G06F 1/20 |

FOREIGN PATENT DOCUMENTS

| | | | | |
|---|---|---|---|---|
| JP | 2019216177 A | * | 12/2019 | |
| WO | WO-2011110390 A1 | * | 9/2011 | H01L 23/473 |
| WO | WO-2021016267 A1 | * | 1/2021 | G06F 1/20 |

* cited by examiner

*Primary Examiner* — Mandeep S Buttar
*Assistant Examiner* — Kyle Oxenknecht
(74) *Attorney, Agent, or Firm* — Hanley, Flight & Zimmerman, LLC

(57) ABSTRACT

An apparatus is described. The apparatus includes a metallic chamber having a first outer surface with first Peltier devices and a second outer surface with second Peltier devices. The first and second outer surfaces face in opposite directions such that the first Peltier devices are to cool first semiconductor chips that face the first outer surface and the second Peltier devices are to cool second semiconductor chips that face the second outer surface.

19 Claims, 16 Drawing Sheets

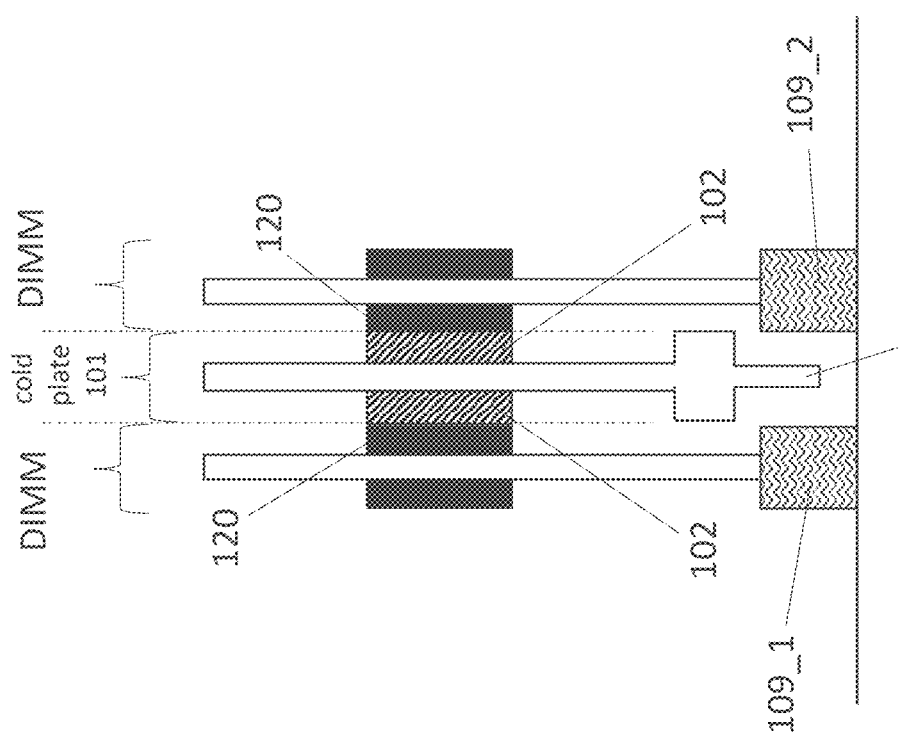

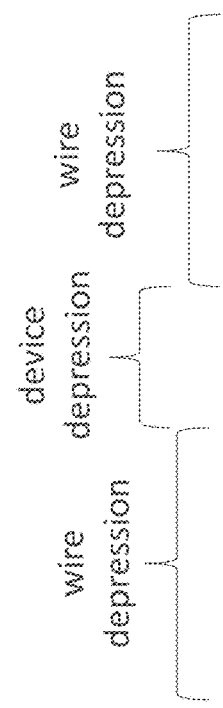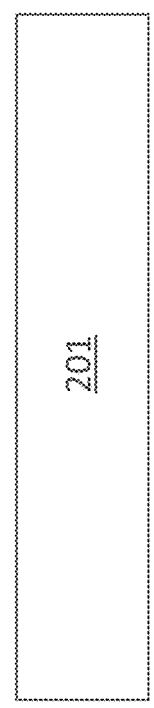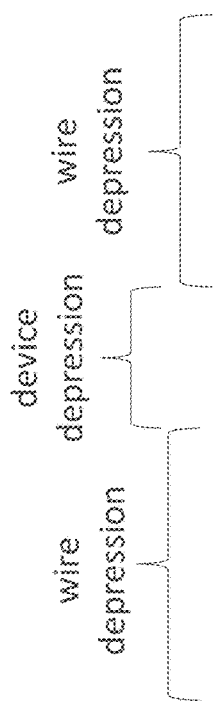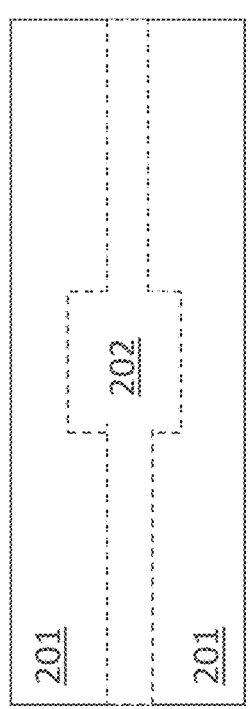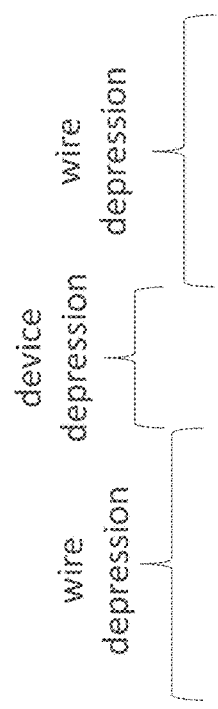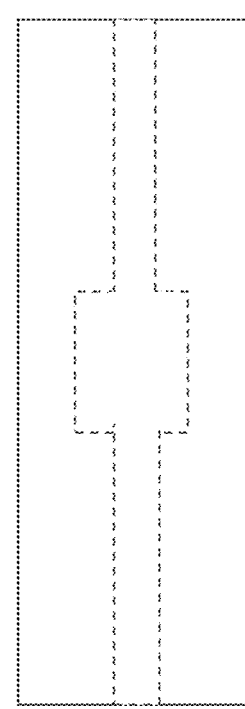
fig. 2a
fig. 2b

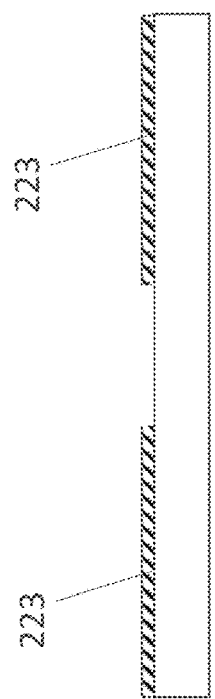
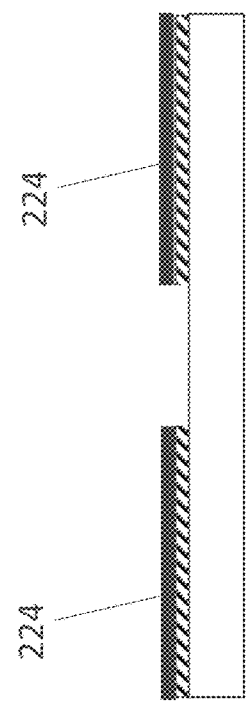
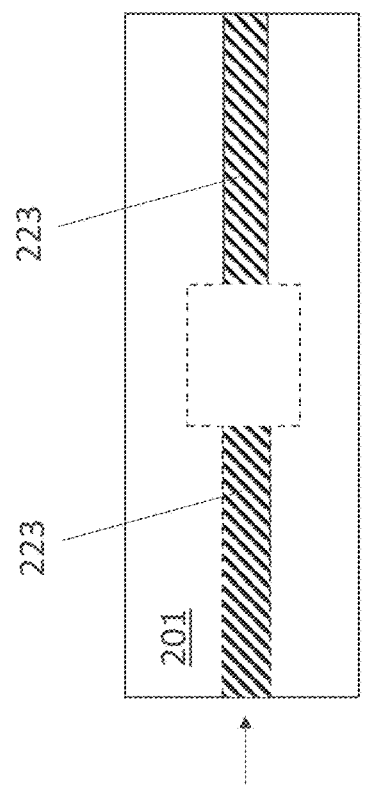
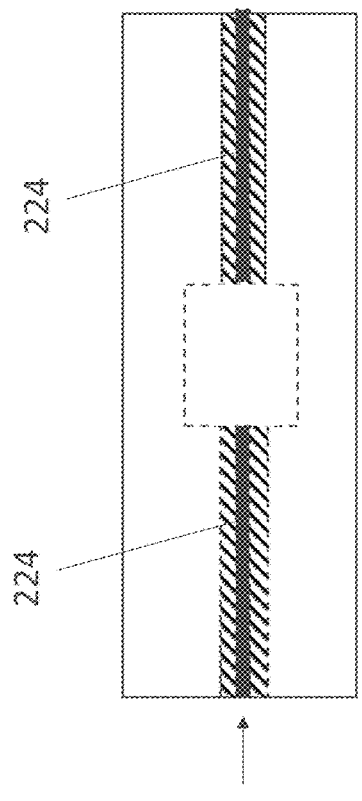

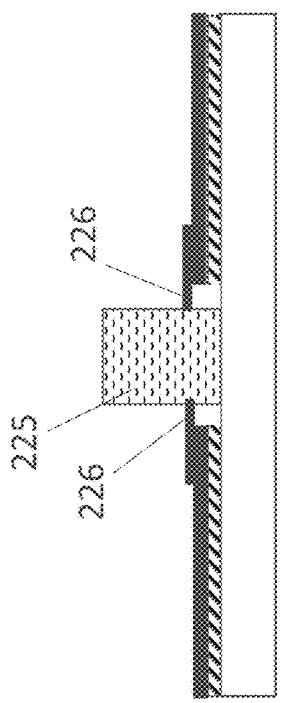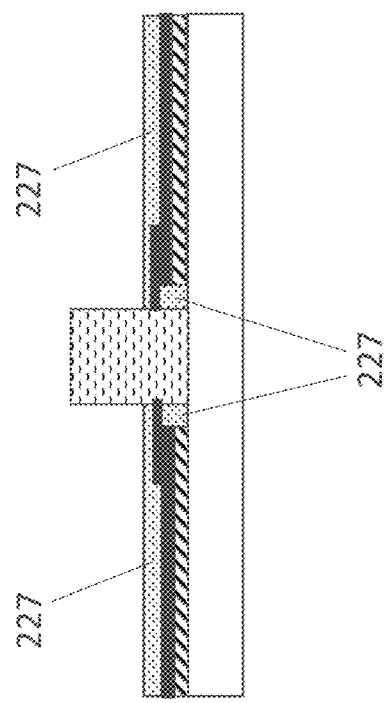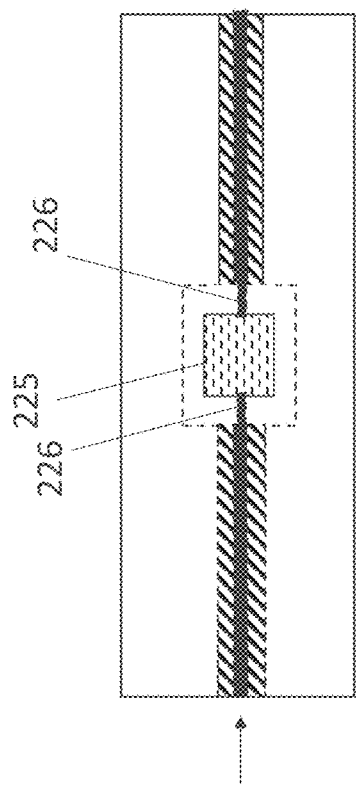
Fig. 2e
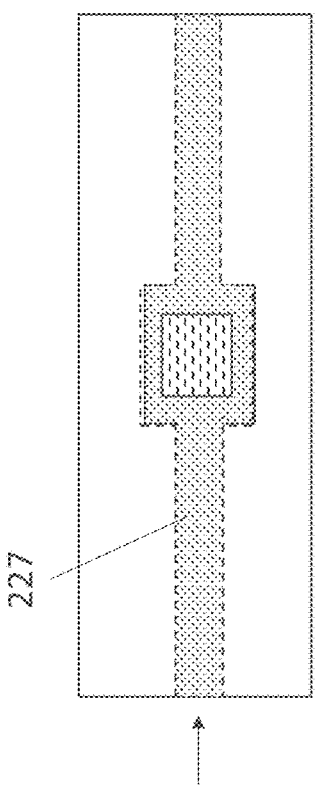
Fig. 2f

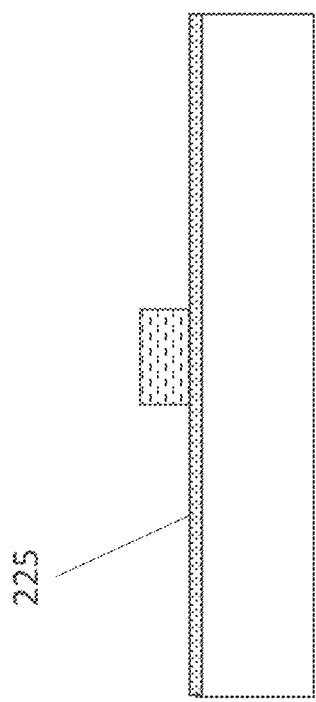
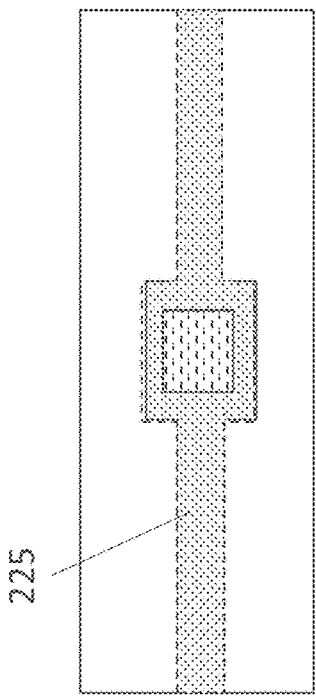
Fig. 2g

TUNABLE STACK-UP DIMM FORM FACTOR COLD PLATE WITH EMBEDDED PELTIER DEVICES FOR ENHANCED COOLING CAPABILITY

BACKGROUND

System design engineers face challenges, especially with respect to high performance data center computing, as both computers and networks continue to pack higher and higher levels of performance into smaller and smaller packages. Creative packaging and cooling solutions are therefore being designed to keep pace with such aggressively designed systems.

FIGURES

A better understanding of the present invention can be obtained from the following detailed description in conjunction with the following drawings, in which:

FIGS. 1a, 1b, 1c, 1d and 1e depict a cold plate with integrated Peltier device;

FIGS. 2a, 2b, 2c, 2d, 2e, 2f and 2g pertain to a method manufacturing a cold plate with Peltier device;

DETAILED DESCRIPTION

FIGS. 1a through 1e show different views of a cold plate 101 having embedded Peltier devices 102_1 through 102_4. As described in more detail further below, the Peltier devices 102_1 through 102_4 make thermal contact with the package lids of a Dual In-Line Memory Module's (DIMM's) semiconductor chips thereby providing enhanced/active cooling capacity. Here, thermal contact means actual contact or a thermal resistance that is equal to or less than that achieved with actual contact (e.g., by placing a thermal interface material between the Peltier devices and the semiconductor chips).

Figure 1A:
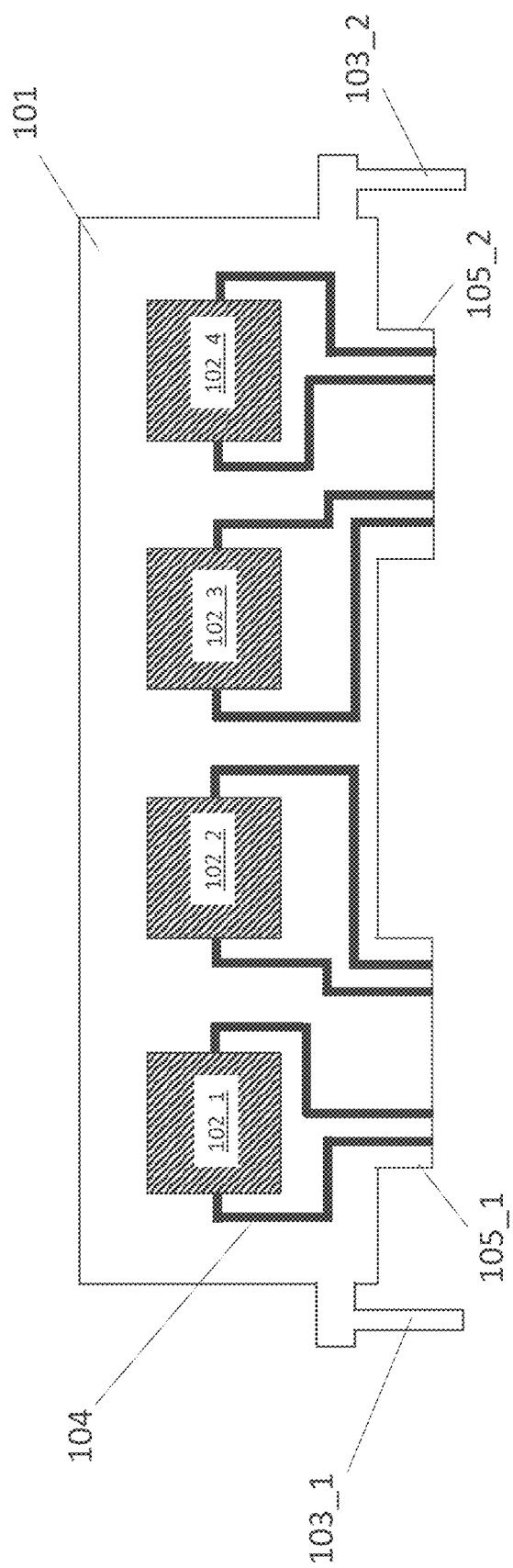
Figure 1B:
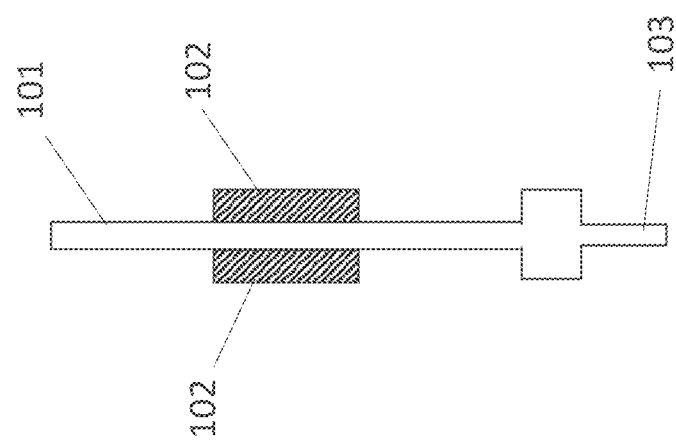

FIG. 1a shows a first side view while FIG. 1b shows a second side view. FIG. 1c, shows a system integration view in which the cold plate 101 is placed between neighboring DIMMs 121_1, 121_2. Here, the cold plate 101 has a DIMM-like form factor so that it can be readily inserted between the neighboring DIMMs 121_1, 121_2.

As can be seen in FIG. 1c, the Peltier devices 102 are thermally coupled to the package lids of the DIMMs' semiconductor chips 120. A Peltier device is typically composed of a multi-layer structure that includes an n type semiconductor and a p type semiconductor. When a DC current is driven through the multi-layer structure, one side of the Peltier device becomes hot while the other side of the Peltier devices become cold. Essentially, in response to the DC current, the Peltier device transfers heat from the cold side to the hot side.

The Peltier devices 102 on the cold plate 101 are therefore arranged such that their cold side is facing outward and in thermal contact with the DIMM semiconductor chips 120 while their hot side is facing inward and in thermal contact with a cold plate 101.

As observed in the particular embodiment of FIGS. 1a, 1b and 1c there are multiple Peltier devices 102_1 through 102_4 on each side of the cold plate 101 and each Peltier device is positioned to be in thermal contact with a different DIMM semiconductor chip package lid. For instance, in the specific example of FIGS. 1a, 1b and 1c, each side of a DIMM has four semiconductor memory chip packages and there are four Peltier devices 102_1 through 102_4 on the corresponding side of the cold plate for each such memory chip package.

Four memory chips per DIMM side is exemplary for ease of drawing. In practice there can be multiple rows of more than four memory chip on a single side of a DIMM. For instance, a DIMM can have four rows of sixteen X4 memory chips per DIMM side for a total of 64 memory chips per DIMM side. In this case there can be 64 Peltier devices per DIMM side. Alternatively, a single Peltier device can be designed to be in thermal contact with more than one DIMM semiconductor chip. For example, a larger surface area Peltier device could be placed in thermal contact with, e.g., two or four memory chips which reduces the number of Peltier devices on the side of the cold plate (e.g., from 64 to 32 or 16).

In operation, heat generated by the DIMM's semiconductor chips 120 are transferred to the chips' respective package lids. The heat is then transferred to the cold side of the Peltier devices 102 which transfer the heat to the hot side of the Peltier devices 102. The heat from the hot side of the Peltier devices 102 is then transferred to a cold plate 101.

The cold plate 101, in various embodiments, is a hollow chamber through which fluid continually flows. Here, referring to FIG. 3a, the cold plate 101 includes a cooled fluid input 103_1 and a warmed fluid output 103_2. Cooled fluid enters the cooled fluid input 103_1 and flows through the cold plate 101. While the fluid is flowing through the cold plate 101 it absorbs heat provided to the cold plate 101 by the hot sides of the Peltier devices 102_1 through 102_4. As discussed at length above, the heat provided by the Peltier devices 102_1 through 102_4 is largely the heat generated by the corresponding DIMM semiconductor chips 120.

With the fluid absorbing heat generated by the DIMM semiconductor chips while it flows through the cold plate 101, the fluid will exit the cold plate 101 as warmed fluid from warmed fluid output port 103_2. The warmed fluid, after it exits the cold plate 101, flows to a cooling apparatus of some kind which removes the heat from the fluid and converts the fluid back to cooled fluid. The cooled fluid is then routed back to the cooled fluid input 103_1 of the cold plate 101 and the process repeats.

Notably, as described above, each Peltier device 102_1 through 102_4 has a DC current driven through it so that the Peltier devices exhibit the desired heat transfer effect. As such, FIG. 1a shows a pair of electrical wires 104 running to each Peltier device 102_1 through 102_4 from electrical edge connector tabs 105_1, 105_2 (for ease of drawing, only one wire is labeled with reference number 104). Per Peltier device, a first wire receives DC current from the host through edge connector tab 105 and injects the Peltier device with the DC current. A second wire receives the DC current from the Peltier device and transports it back to the edge connector tab.

In the specific embodiment of FIG. 1a, there are four Peltier devices on both sides of the cold plate. The left side edge connector tab 105_1 includes the wire connections for the "left hand side" Peltier devices on both the observed front and non-observed back of the cold plate. The right side edge connector tab 105_2 includes the wire connections for the "right hand side" Peltier devices on both the observed front and non-observed back of the cold plate.

For illustrative ease none of FIG. 1a, 1b or 1c show the mechanical, electrical or fluidic connections between the host (e.g., the PC motherboard of a computer) and the cold plate 101.

Figure 1D:
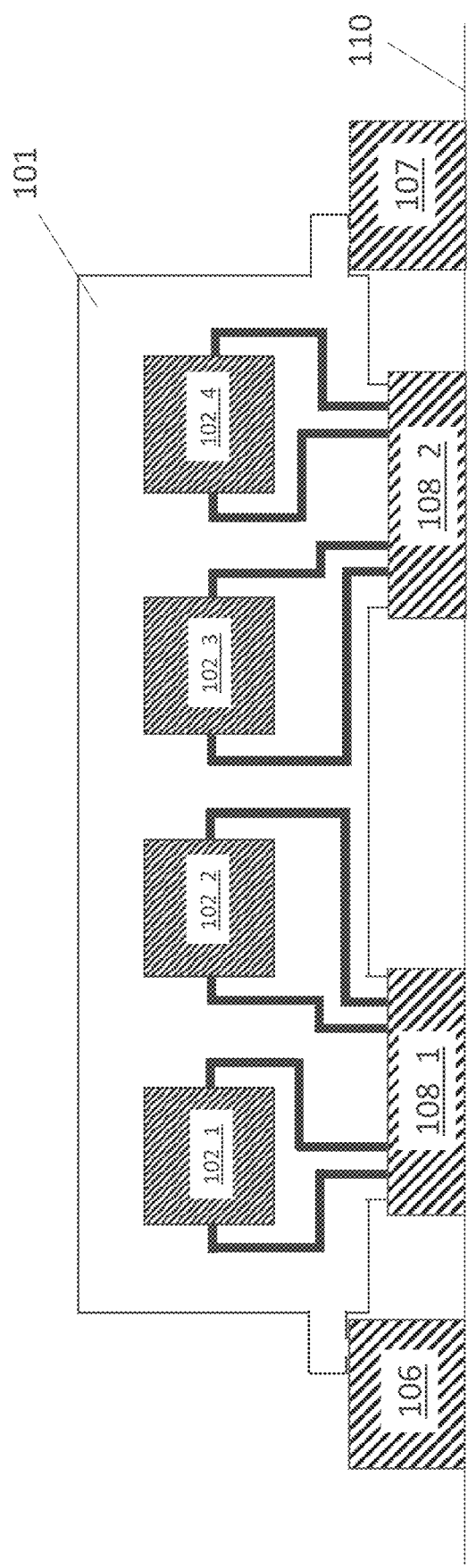
Figure 1E:
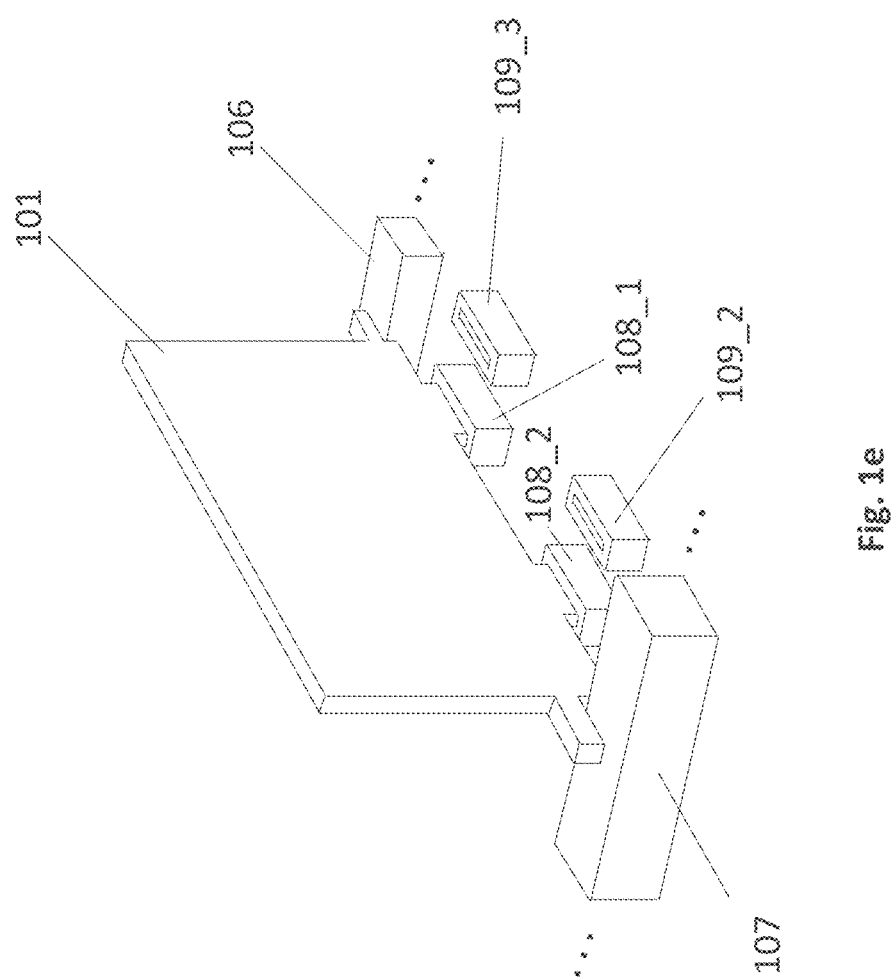

FIGS. 1d and 1e, by contrast, depict an embodiment for these connections. Specifically, to address the fluidic connections, the cooled fluid input port 103_1 plugs into a cooled fluid manifold 106 and the warmed fluid output port 103_2 plugs into a warmed fluid manifold 107. To address the electrical connections, the edge connector tabs 105_1, 105_2 plug into electrical sockets/connectors 108_1, 108_2.

With respect to the fluidic connections, importantly, both manifolds 106, 107 run an extended distance before and after the location of the cold plate 101 so that other cold plates (not shown in FIG. 1e) can also plug into them. Said another way, the manifolds 106, 107 are arranged to run off both edges of a bank of DIMMs with interleaved cold plates between them. DIMMs can plug into connectors on either side of the cold plate resulting in the structure of FIG. 1c. Here, DIMM connectors 109_2, 109_3 off the "right side" of cold plate 101 are visible in FIG. 1e, whereas, DIMM connector 109_1 off the "left side" of the cold plate 101 and DIMM connector 109_2 off the right side of cold plate 101 are visible in FIG. 1c. Thus, in FIG. 1e, the electrical connector 108_2 is between DIMM connectors 109_1 and 109_2, where the DIMM connector 109_1 is blocked from view in FIG. 1e by the cold plate 101 but visible in FIG. 1c).

Importantly, another cold plate can be placed in thermal contact with one of the exposed DIMM sides of FIG. 1c and the resulting DIMM/cold plate/DIMM/cold plate structure can be repeated to realize an entire bank of DIMMs with interleaved cold plates. Here, the manifolds 106, 107 are extended from their depiction in FIG. 1e so that they run off the edges of the DIMMs and cold plates in the DIMM bank so that each DIMM's fluidic input and output ports 103_1, 103_2 can plug into the corresponding manifolds 106, 107.

In operation, cooled fluid runs through the cooled fluid manifold 106 and feeds cooled fluid to each DIMM's cooled fluid input port 103_1. The DIMMs warm the respective fluid that flows through them. The DIMMs then collectively emit warmed fluid from their warm fluid output ports 103_2 into the warmed fluid manifold 107. The warmed fluid in warmed fluid manifold 107 is routed to a liquid cooling apparatus of some kind which converts the warmed fluid to cooled fluid. The cooled fluid is returned to the cooled fluid manifold 106 and the process repeats.

With respect to the electrical connections, FIGS. 1d and 1e depict the host side electrical connectors 108_1, 108_2 into which the cold plate's electrical tabs 105_1, 105_2 are inserted. Here, tabs 105_1, 105_2 are essentially edge connectors that emanate from the cold plate 101, as shown in FIG. 1a, and that slide into connectors 108_1, 108_2. The host board 110 includes the circuitry (e.g., current sources) to drive the DC currents through the Peltier devices. As such, these currents first flow into the host connectors 108_1, 108_2 and then the tabs 105_1, 105_2, and then through the Peltier devices 102_1 through 102_4. The currents are then returned from the Peltier devices back through the edge connectors 105_1, 105_2 and into host connectors 108_1, 108_2.

Again, only four Peltier devices per side are depicted. In other embodiments, many more Peltier devices can be present per side. As such, more than two edge connector tabs 105_1, 105_2 may extend from the cold plate (or, only one longer edge connector tab extends from the cold plate).

Regardless, in various embodiments, the fluidic and electrical connectors are sufficient mechanical connections between the host PC board 110 and cold plate 101 to rigidly support the location and placement of the cold plate 101 in the system.

With an overview of the cold plate 101, its operation and system integration having been described, various additional features of the cold plate's structure and fabrication are next described.

FIGS. 2a through 2g depict a design and manufacturing process for the cold plate surface. For ease of discussion, the processing associated with only one Peltier device and its associated wiring is presented.

FIG. 2a shows a cold plate surface 201 prior to the placement and attachment of a Peltier device and its associated wiring. Here, the left hand side of FIG. 2a depicts a top down view whereas the right hand side depicts a side view along ray 221. As observed in the top down view there are grooves or depressions 202 formed in the surface of the cold plate where the Peltier devices and its wires are to be placed.

Here, in various embodiments the cold plate is metallic (composed of a metal (e.g., copper) or metal alloy (e.g., bronze)) so that it transfers heat from the Peltier devices to the internal liquid with little thermal resistance. The depressions 202 can be formed, e.g., by a mold that shapes the cold plate surface during manufacturing of the cold plate, or, the depressions 202 can be etched into the cold plate's surface after the cold plate manufacturing process has yielded a smooth, flat surface cold plate surface.

FIG. 2b presents the same cold plate surface with the same depressions as in FIG. 2a but where the right hand side view is looking along a different ray 222. Here, the right hand side of FIG. 2a looks along ray 221 which follows the depression trenches end to end, whereas, the right hand side of FIG. 2b does not look along the depression trenches. As such, the right hand side of FIG. 2a shows the surface of the depressions whereas the right side of FIG. 2b shows the surface of the cold plate where no depression exists.

The following FIGS. 2c through 2f are viewed along the ray 221 that follows the depression(s) made for the wires and Peltier device.

As observed in FIG. 2c, an epoxy 223 is coated inside the depressions where the wires are to be placed. In various embodiments, the epoxy 223 not only has the epoxy-like characteristics (e.g., is applied as a gel and then can be hardened/cured) but also has high electrical resistance (is a dielectric) and has some appreciable elasticity. Here, as will be more clear in the following discussion, the dielectric property of the epoxy 223 electrically isolates the wires from the conductive cold plate 201 while the elastic property helps preserve mechanical integration of the wiring by absorbing any thermal mismatch differences between the cold plate and the wires.

As observed in FIG. 2d, wires 224 are placed into the epoxy 223 before the epoxy has been cured (e.g., while the epoxy is a gel). Here, the wires 224 can be rigid metallic strips or thinner strips of metallic foil (e.g., composed of metal or a metal alloy). Notably, looking at the top down view on the left hand side of FIG. 2d, the wires 224 are thinner than the width of the depressions so that the epoxy 223 resides not only beneath the wires 224 (as observed in the right hand side of FIG. 2d) but also along the sides of the wires 224.

The epoxy 223 is then allowed to cure (harden) which secures the wires 224 to the cold plate. As mentioned above, even after hardening the epoxy 223 has some elasticity to absorb differences in thermal coefficient expansion between the wires 224 and the cold plate 201. The epoxy 223 can be implemented with various epoxies that are soft/flexible after curing.

As observed in FIG. 2e, the Peltier device 225 is next placed in the depression that is reserved for the Peltier device. The Peltier device 225 has electrical leads 226 that are approximately aligned with (e.g., slightly higher than) the wires 224. The electrical 226 leads are then soldered to the wires 224. In an embodiment, the Peltier device 225 is firmly pressed down upon into the cold plate before the leads 226 are bent and/or soldered to the wires 224 which coarsely keeps the Peltier device 225 against into the cold plate after the solder has reflowed and hardened.

After the leads 226 have been soldered to the wires 224, referring to FIG. 2f, the Peltier device 225 is again firmly pressed into the cold plate surface and the depressed regions surrounding the Peltier device 225 and the wires 224 are covered with another layer of epoxy 227.

The second layer 227, when applied, has some viscosity so that it can surround the leads 226 and the periphery of the Peltier 225 device along the depression floor and in the volume of space in-between. The firm pressure applied to the Peltier device 225 is maintained during curing of the second epoxy 227 so that the Peltier device 225 continues to be firmly pressed into the cold plate after the second epoxy 227 has hardened. So doing keeps low thermal resistance between the Peltier device 225 and the cold plate. The second epoxy 227 is also electrically insulating in various embodiments to electrically isolate the leads 226 and wires 224. The second epoxy 227 can be implemented with various epoxies including epoxies that are harder (less soft) after curing than the first epoxy 223, or, epoxies that are thicker than the first epoxy 223.

FIG. 2g shows another view of the structure of FIG. 2f but along a ray 222 that does not point along where the depressions were made. Here, looking at the right hand side view, some of the second epoxy 227 is visible. The top of the Peltier device 225 is nevertheless manifestly protruding from the surface of the cold plate thereby forming the leading surface that will make contact with the corresponding DIMM semiconductor chip package lids.

In an extended embodiment, before the second epoxy 227 is applied, the floor of the depression around the periphery of the Peltier device 225 is lined with the first epoxy 223. The second epoxy 227 is then applied as described above but on top of the first epoxy 223 around the periphery of the Peltier device. Here, the first epoxy 223 helps absorb thermal expansion differences between the second epoxy 227 and the cold plate without affecting the firm downward pressure applied to the Peltier device 225.

In various embodiments, cold plates are manufactured by forming two separate plate halves (one for each side), forming and processing the halves as described above and then sealing the halves together to form the complete cold plate (space exists between the two halves within the cold plate thereby forming the internal chamber). In various embodiments an O-ring is placed between the two halves to not only seal the chamber but also assist in the placement of the Peltier devices on the semiconductor package chip lids of the neighboring DIMMs. More details concerning such an O-ring are provided in more detail below with respect to FIGS. 4 and 5.

Figure 3:
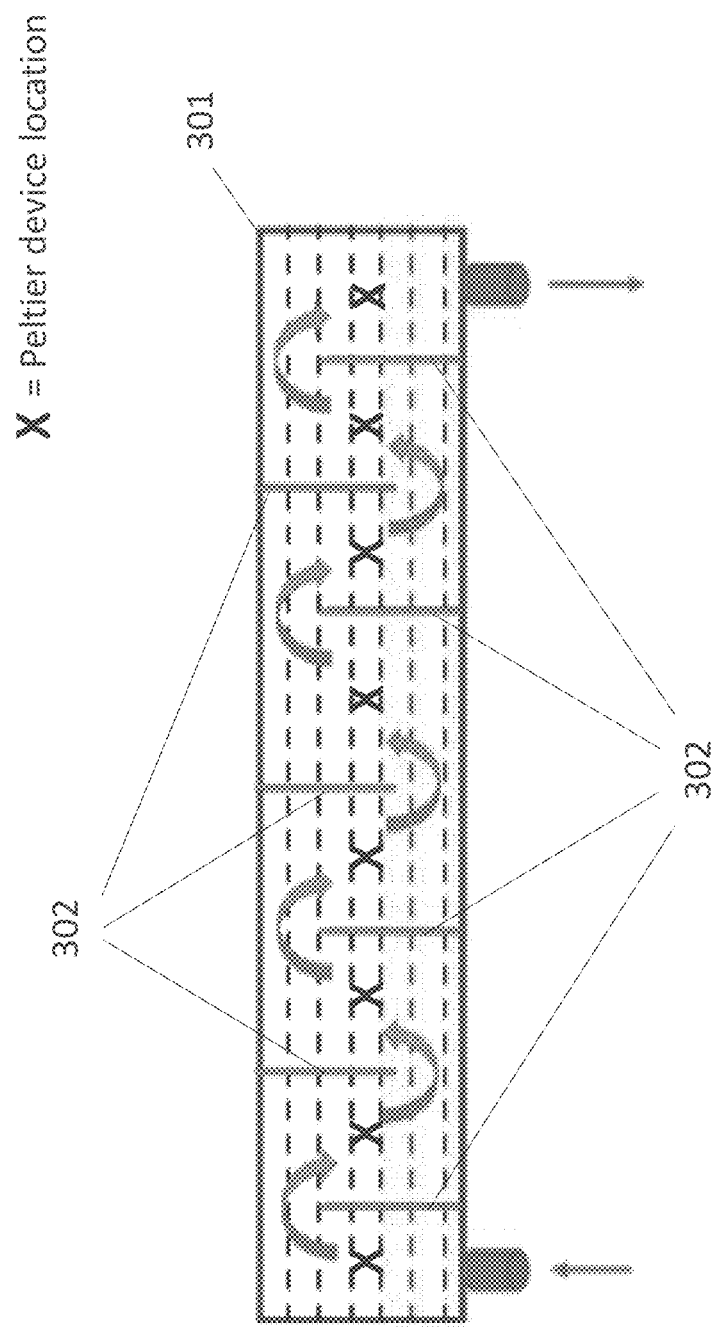
FIG. 3 shows a fluidic channel within a cold plate chamber.

FIG. 3 shows an internal structure of a cold plate 301. As observed in FIG. 3, the cold plate 301 includes internal fins 302 that form a structured fluidic channel within the cold plate 301 that improves the efficiency of the cooling across the surface area of the Peltier devices (which are on the other side of the cold plate wall).

More particularly, the fins 302 form an alternating series of upward and downward vertical flows within the cold plate 301. Here, by designing the locations of the fins 302 such that a Peltier device is centered within a particular vertical or downward flow, each Peltier device will receive a full "wash" of the cold plate's fluid on the underside of the region of the cold plate where it is located. This helps improve the heat transfer from the Peltier device to the fluid.

Figure 4:
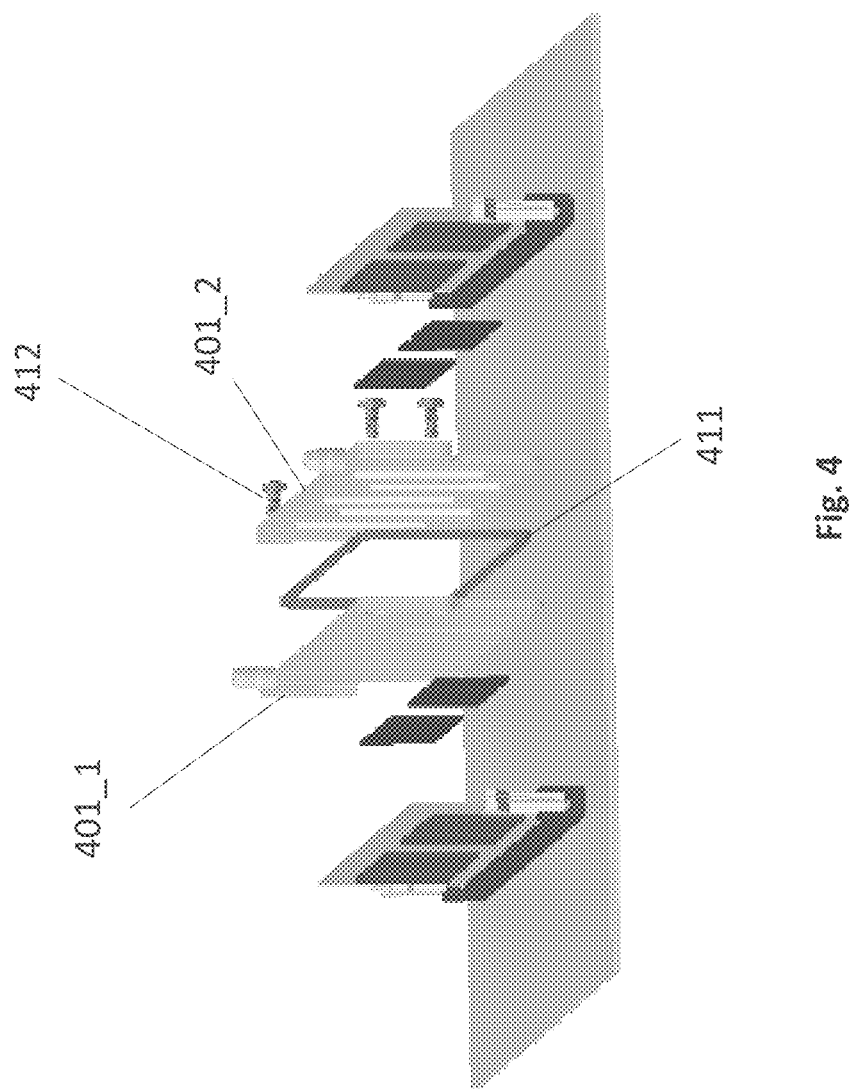
FIG. 4 shows an O ring between two cold chamber halves.

FIG. 4 shows an exploded view of additional possible features of the cold plate. As observed in FIG. 4, the cold plate is implemented as left 401_1 and right 401_1 portions that are sealed together to form a complete cold plate 401 which internal fluidic channels. An O-ring 411 is seated between the portions 401_1, 401_2. The cold plate halves 401_1 have threaded holes in the corners. Screws 412 are threaded into the through holes and the cold plate portions 401_1, 401_2 are compressed together with the O-ring in between 411. The O-ring 411 preserves the mechanical integrity of the fluidic channels within the cold plate (prevents leaks) by elastically filling various pits/grooves or other imperfections in the cold plates that would by themselves result in a leak.

The O-ring 411 can also add a dimension of mechanical tolerance in applications having, e.g., aggressively small spacings between DIMMs. Specifically, the screws can be tightened further to compress the cold plate portions 401_1, 401_2 closer together (the O-ring 411 becomes more compressed) thereby reducing the width of the cold plate. By contrast, if the mechanical spacings are more forgiving, the screws need not be tightened as much which relaxes the compression of the O-ring 411 and causes the portions 401_1, 401_2 to expand away from each other slightly thereby expanding the width of the cold plate. In either the extremely compressed or less compressed scenarios the O-ring 411 prevents leaks.

This later technique of expanding the cold plate portions 401_1, 401_2 away from one another can also be used to ensure good thermal contact between the Peltier devices and the chips on the cold plate's neighboring DIMMs. For example, in order to mechanically integrate the cold plate in between neighboring DIMMs, the screws are tightly torqued to compress the cold plate portions tightly together thereby minimizing the width of the DIMM (from outer surface to outer surface).

The minimal DIMM width allows the DIMM to be easily inserted in between two neighboring DIMMs. After the cold plate has been fixed in place (e.g., secured to the manifolds and electrical host connectors) the screws are loosened which cause the cold plate portions 401_1, 401_2 to expand away from each other until their Peltier devices make thermal contact with their corresponding DIMMs (the O-ring expands in response to the loosening of the screws which causes the cold plate portions 401_1, 401_2 to move away from each other).

Figure 5:
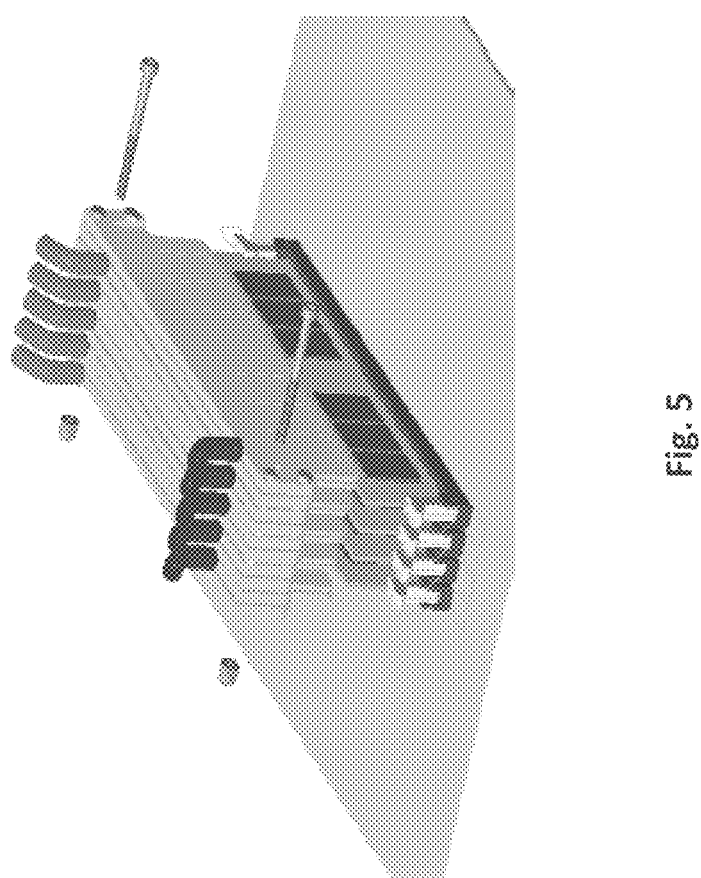
FIG. 5 shows a stacked-up cold chamber solution.

FIG. 5 shows a related mechanical integration approach in which the cold plates for, e.g., an entire DIMM bank, are "stacked up" with their interleaved DIMMs in between and mounted together as a single cohesive unit (for ease of drawing FIG. 5 shows the stack of cold plates without the interleaving DIMMs in between the cold plates). The screws are tightened to secure the stack and DIMMs in position such that the DIMMs are aligned with their host board connectors (and the cold plates are aligned with their host board connectors).

The entire unit (multiple DIMMs interleaved with multiple cold plates) is then plugged into the host board (the multiple DIMMS and cold plates are plugged into the host system in parallel). The screws can then be adjusted as described above to ensure the Peltier devices are in contact with the chip lids of their neighboring DIMMs.

Note that the particular embodiments of FIGS. 4 and 5 suggest the fluidic input and output ports do not plug into manifolds that run along the bottoms of the cold plates but rather attach to conduits (not shown) that are located above the cold plates (looking at FIGS. 4 and 5, the fluidic input and output ports are on the upper edges of the cold plate(s)). Similar (e.g., upper edge) connections can also exist with respect to the electrical connections. Thus, the stacked-up and O-ring approaches described just above are not limited to a cold plate having bottom side fluidic and/or electrical connections as discussed above with respect to FIGS. 1*a* through 1*e*.

In various embodiments, the above described cold plate embodiments, whether individually connected to the host PC board as described above with respect to FIGS. 1*a* through 1*e*, or, in a stack-up solution as described above with respect to FIG. 5, are capable of being inserted between tightly pitched DIMM solutions such as a Joint Electron Device Engineering Council (JEDEC) dual data rate "5" (DDR5) solution having a 300 mm pitch between neighboring DIMMs (the cold plate can be properly position within the 300 mm spacing).

Although the above teachings have emphasized a cold plate in which liquid coolant continually flows through the cold plate, in other embodiments, conceivably, a vapor chamber could be used instead of a cold plate (a so called "two phase" cooling approach). In a vapor chamber approach, the vapor chamber is structured similar to the above described cold plate except that the liquid within the chamber boils in response to the heat that is received from the Peltier devices. The boiling creates vapor. The vapor is then cooled (condensed) back to a liquid thereby removing heat from the liquid. The vapor can be condensed entirely within the DIMM form factor chamber in which case fluidic connections need not be made to the chamber. Alternatively, or in combination, the vapor can be vented from the DIMM form factor chamber (e.g., into manifolds), condensed externally, and the resulting cooled liquid returned to the chamber (through a cooled fluid input conduit/connection).

Figure 6:
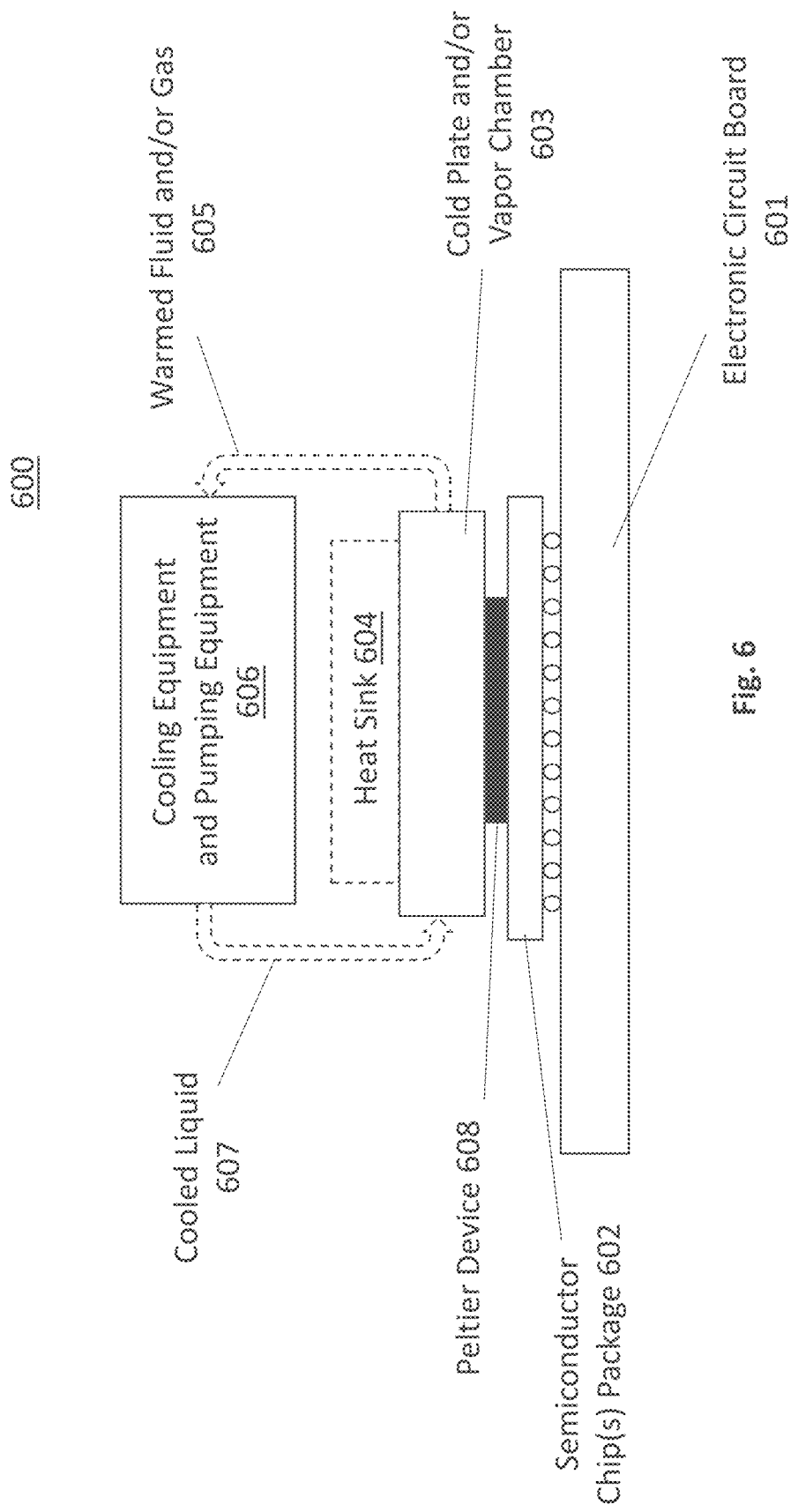
FIG. 6 shows a liquid cooling apparatus.

The teachings above can be applied to the cooling apparatus 600 of FIG. 6. FIG. 6 depicts a general cooling apparatus 600 whose features can be found in many different kinds of semiconductor chip cooling systems. As observed in FIG. 6, one or more semiconductor chips within a package 602 (such as memory chips) are mounted to an electronic circuit board 601 (such as a DIMM). A cold plate 603, such as the cold plates described above, is thermally coupled with the package 602 (e.g., by way of a Peltier device 608 that is attached to the cold plate) so that the cold plate 603 receives heat generated by the one or more semiconductor chips (the cold plate 603 can also be referred to as a vapor chamber in the case of two-phase cooling systems).

Liquid coolant is within the cold plate 603. If the system also employs air cooling (optional), a heat sink 604 can be thermally coupled to the cold plate 603. Warmed liquid coolant and/or vapor 605 leaves the cold plate 603 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 606. Cooled liquid 607 then enters the cold plate 603 and the process repeats.

With respect to the cooling equipment and pumping equipment 606, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 606 can be supplied by the cold plate of one semiconductor chip package or the respective cold plate(s) of multiple semiconductor chip packages.

In the case of the later (intake received from cold plate(s) of multiple semiconductor chip packages), the semiconductor chip packages can be components on a same electronic circuit board or multiple electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers). In essence, the general depiction of FIG. 6 describes compact cooling systems (e.g., a cooling system contained within a single electronic system), expansive cooling systems (e.g., cooling systems that cool the components of any of a rack, multiple racks, a data center, etc.) and cooling systems in between.

Although FIG. 6 shows the Peltier device 608 in direct contact with a semiconductor chip package, in other embodiments one or more intervening structure(s) can exist along the thermal path between the Peltier device and the semiconductor chip package (e.g., thermal interface material (TIM)).

Figure 7:
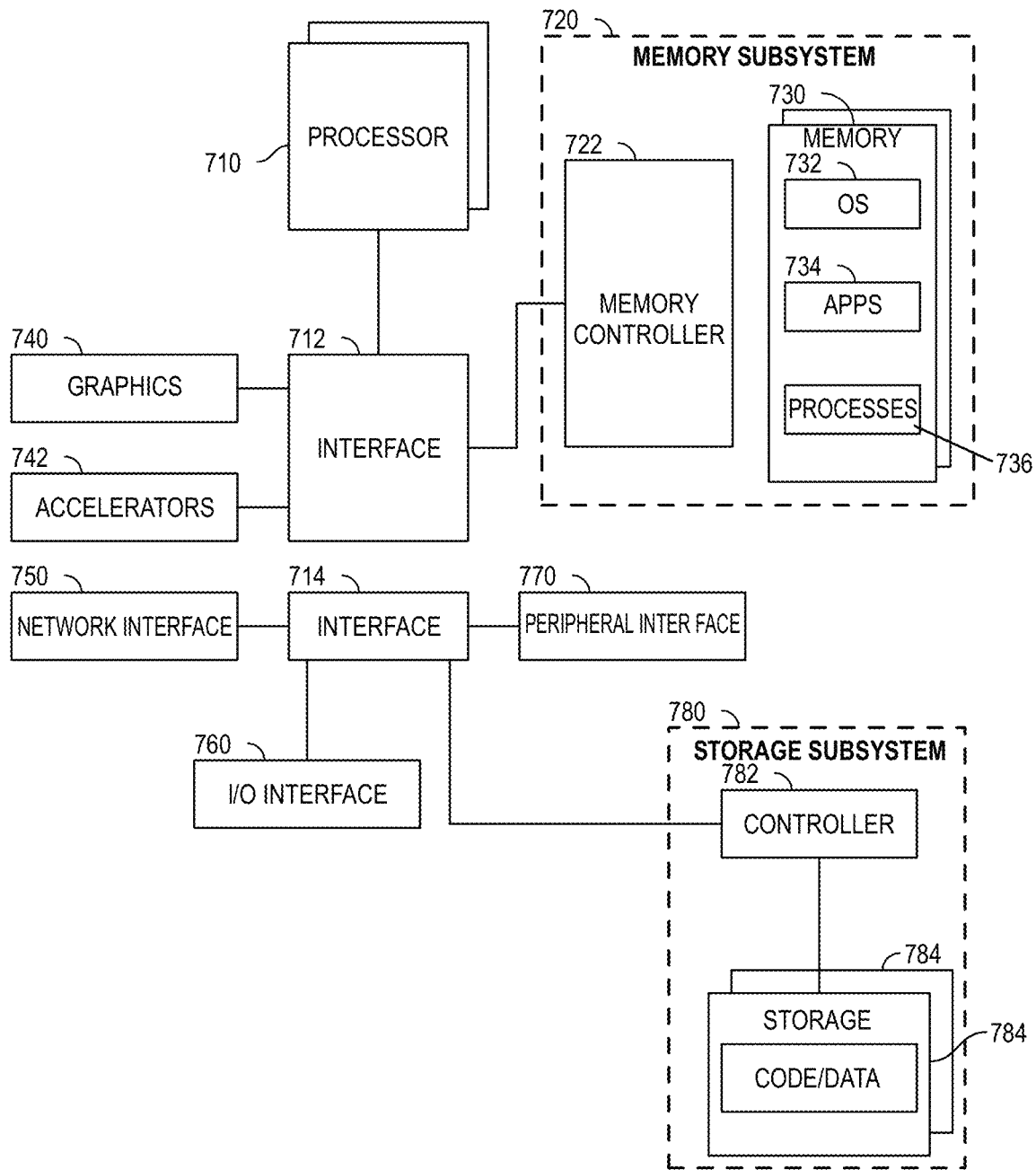
FIG. 7 shows a computing system.
Figure 8:
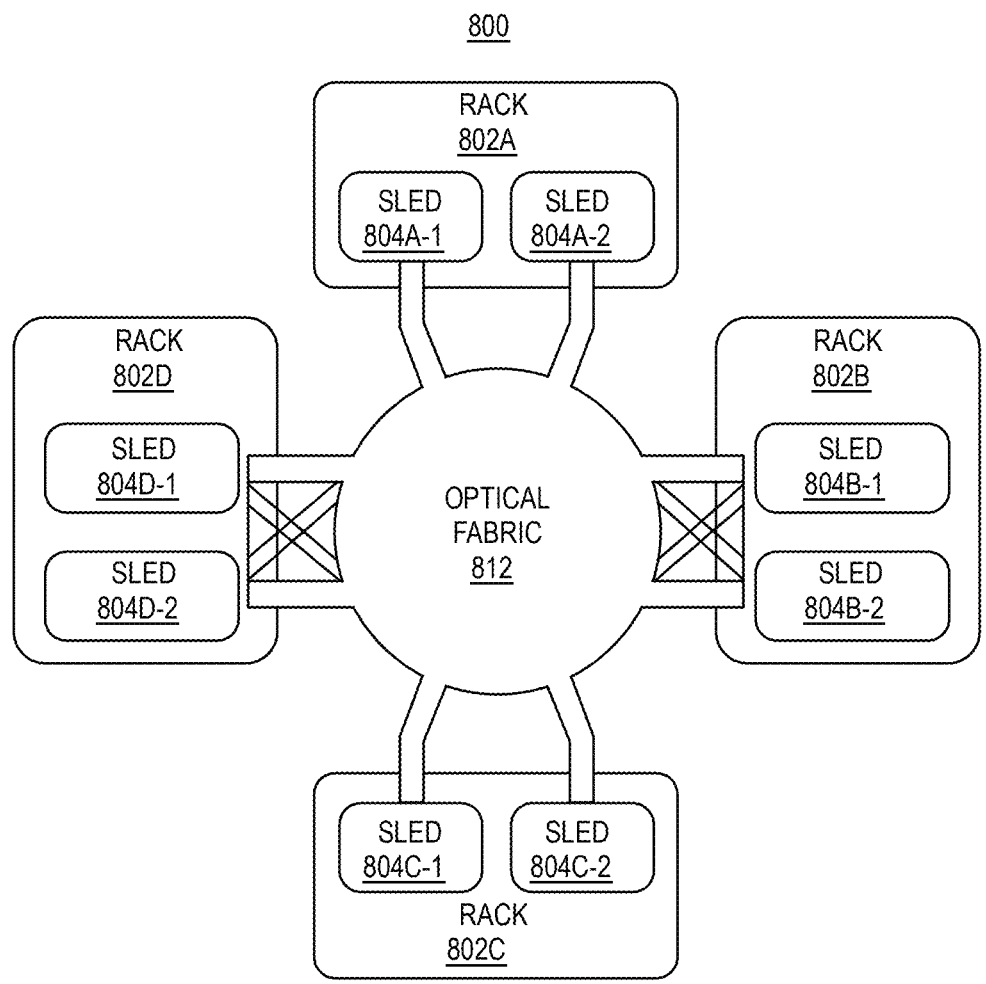
FIG. 8 shows a data center.
Figure 9:
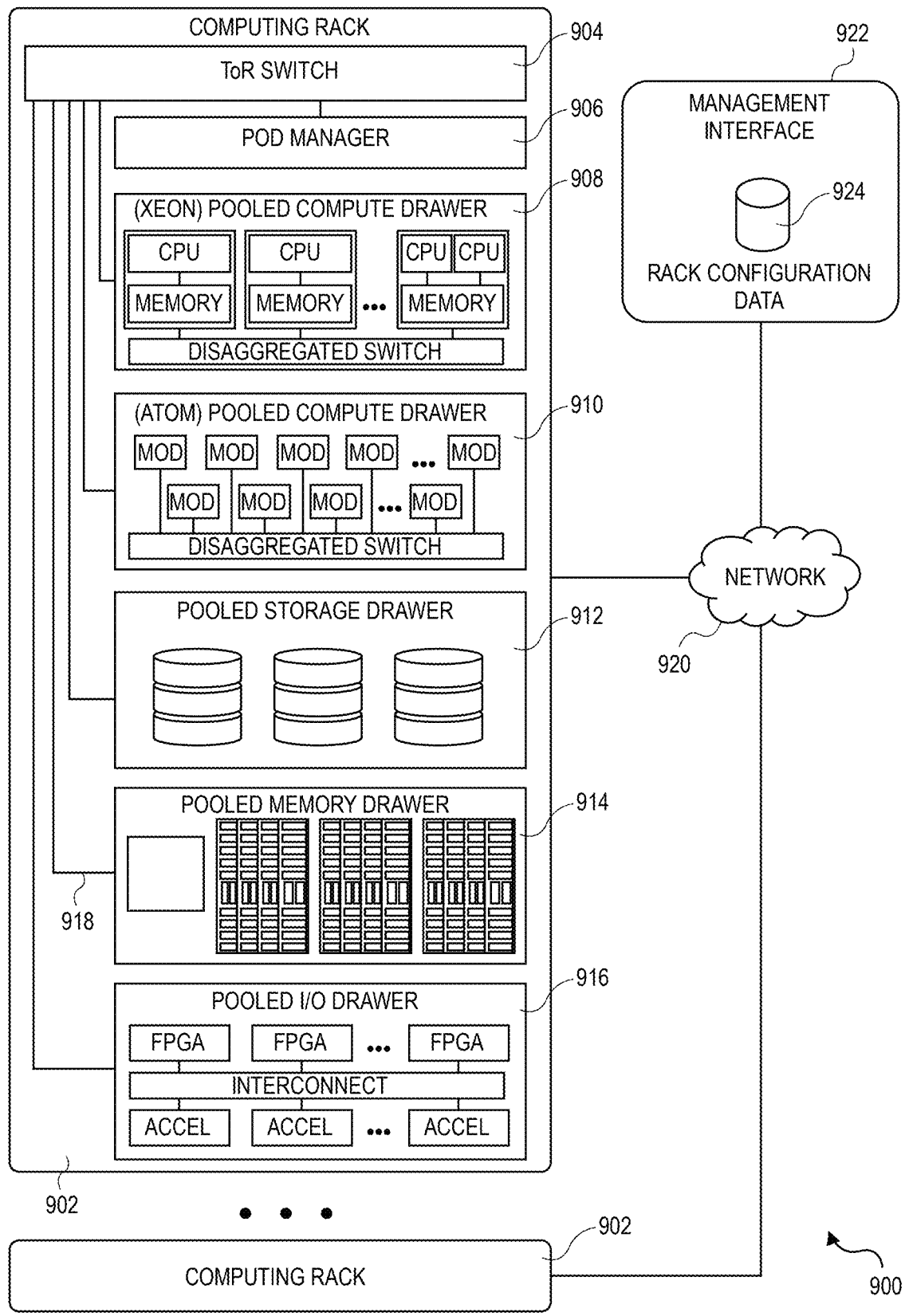
FIG. 9 shows a rack.

The following discussion concerning FIGS. 7, 8 and 9 are directed to systems, data centers and rack implementations, generally. As such, FIG. 7 generally describes possible features of an electronic system that can include one or more DIMMs that are cooled according to the teachings above. FIG. 8 describes possible features of a data center that include such electronic systems. FIG. 9 describes possible features of a rack having one or more such electronic systems installed into it.

FIG. 7 depicts an example system. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, volatile memory, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software functionality to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, Aug. 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

Any of the memory solutions described above can be implemented with DIMMs that are cooled according to the teachings above.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 700 includes interface 714, which can be coupled to interface 712. In one example, interface 714 represents an interface circuit, which can include stand-alone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a remote device, which can include sending data stored in memory. Network interface 750 can receive data from a remote device, which can include storing received data into memory. Various embodiments can be used in connection with network interface 750, processor 710, and memory subsystem 720.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a non-volatile manner, such as one or more magnetic, solid state, or optical based disks, or a combination. Storage 784 holds code or instructions and data in a persistent state (e.g., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (e.g., the value or state of the data is indeterminate if power is interrupted to system 700). In one example, storage subsystem 780 includes controller 782 to interface with storage 784. In one example controller 782 is a physical part of interface 714 or processor 710 or can include circuits in both processor 710 and interface 714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 7, other types of systems to which the above described invention can be applied and are also partially or wholly described by FIG. 7 are communication systems such as routers, switches and base stations.

FIG. 8 depicts an example of a data center. Various embodiments can be used in or with the data center of FIG. 8. As shown in FIG. 8, data center 800 may include an optical fabric 812. Optical fabric 812 may generally include a combination of optical signaling media (such as optical cabling) and optical switching infrastructure via which any particular sled in data center 800 can send signals to (and receive signals from) the other sleds in data center 800. However, optical, wireless, and/or electrical signals can be transmitted using fabric 812. The signaling connectivity that optical fabric 812 provides to any given sled may include connectivity both to other sleds in a same rack and sleds in other racks.

Data center 800 includes four racks 802A to 802D and racks 802A to 802D house respective pairs of sleds 804A-1 and 804A-2, 804B-1 and 804B-2, 804C-1 and 804C-2, and 804D-1 and 804D-2. Thus, in this example, data center 800 includes a total of eight sleds. Optical fabric 812 can provide sled signaling connectivity with one or more of the seven other sleds. For example, via optical fabric 812, sled 804A-1 in rack 802A may possess signaling connectivity with sled 804A-2 in rack 802A, as well as the six other sleds 804B-1, 804B-2, 804C-1, 804C-2, 804D-1, and 804D-2 that are distributed among the other racks 802B, 802C, and 802D of data center 800. The embodiments are not limited to this example. For example, fabric 812 can provide optical and/or electrical signaling.

FIG. 9 depicts an environment 900 that includes multiple computing racks 902, each including a Top of Rack (ToR) switch 904, a pod manager 906, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 908, and INTEL® ATOM™ pooled compute drawer 910, a pooled storage drawer 912, a pooled memory drawer 914, and a pooled I/O drawer 916. Each of the pooled system drawers is connected to TOR switch 904 via a high-speed link 918, such as a 40 Gigabit/second (Gb/s) or 100 Gb/s Ethernet link or an 100+Gb/s Silicon Photonics (SiPh) optical link. In one embodiment high-speed link 918 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 900 may be interconnected via their TOR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations. RSD environment 900 further includes a management interface 922 that is used to manage various aspects of the RSD environment. This includes managing rack configuration, with corresponding parameters stored as rack configuration data 924.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAS, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus comprising:
   a metallic cold plate defining a chamber, the metallic cold plate having a first outer surface and a second outer surface, the first and second outer surfaces facing in opposite directions; and
   first Peltier devices coupled to the first outer surface, the first Peltier devices to cool first semiconductor chips that face the first outer surface; and
   second Peltier devices coupled to the second outer surface, the second Peltier devices to cool second semiconductor chips that face the second outer surface, wherein respective wires for the first and second Peltier devices are mechanically integrated with the first and second outer surfaces.

2. The apparatus of claim 1, wherein the first semiconductor chips are components of a first Dual In-Line Memory Module (DIMM) and the second semiconductor chips are components of a second DIMM.

3. The apparatus of claim 1, wherein the first Peltier devices are located in grooves formed in the first outer surface.

4. The apparatus of claim 1, wherein the respective wires run to at least one electrical connector that is mechanically integrated with the metallic cold plate.

5. The apparatus of claim 1, wherein an elastic epoxy resides between the respective wires and the first and second outer surfaces.

6. The apparatus of claim 1, wherein the metallic cold plate has a fluidic input and a fluidic output.

7. The apparatus of claim 1, wherein the metallic cold plate has internal fins positioned to form a fluidic channel that causes a same fluid to cool more than one of the first Peltier devices.

8. An apparatus comprising:
   a metallic cold plate including a first plate having a first outer surface with first Peltier devices and a second plate having a second outer surface with second Peltier devices, the first and second outer surfaces facing in opposite directions, the metallic cold plate defining a chamber and including an O-ring, the chamber sealed with the O-ring between the first and second plates;
   a first Dual In-Line Memory Module (DIMM) having first packaged semiconductor chips in thermal contact with the first Peltier devices; and
   a second DIMM having second packaged semiconductor chips in thermal contact with the second Peltier devices, the metallic cold plate including a threaded element to lessen compression of the first and second plates to cause the O-ring to expand and press the first Peltier devices into the first packaged semiconductor chips and press the second Peltier devices into the second packaged semiconductor chips.

9. The apparatus of claim 8, wherein the first Peltier devices are located in grooves formed in the first outer surface.

10. The apparatus of claim 8, wherein respective wires for the first and second Peltier devices are mechanically integrated with the first and second outer surfaces.

11. The apparatus of claim 8, wherein respective wires run to at least one electrical connector that is mechanically integrated with the metallic cold plate and is connected to a PC board that the first and second DIMMs are installed upon.

12. The apparatus of claim 10, wherein an elastic epoxy resides between the respective wires and the first and second outer surfaces.

13. A data center, comprising:
multiple racks;
at least one network;
pumping and cooling equipment to receive warmed fluid and to provide cooled fluid; and
multiple electronic systems that are installed into the multiple racks and are communicatively coupled by the at least one network, wherein, at least one of the electronic systems includes:
- a cold plate including a first plate having a first outer surface with first Peltier devices and a second plate having a second outer surface with second Peltier devices, the first and second outer surfaces facing in opposite directions, the cold plate including a fluidic input to receive the cooled fluid and a fluidic output to provide the warmed fluid, the cold plate including an O-ring, the cold plate defining a chamber sealed with the O-ring between the first and second plates;
- a first Dual In-Line Memory Module (DIMM) having first packaged semiconductor chips that are in thermal contact with the first Peltier devices; and
- a second DIMM having second packaged semiconductor chips that are in thermal contact with the second Peltier devices, the cold plate including a threaded element to lessen compression of the first and second plates to cause the O-ring to expand and press the first Peltier devices into the first packaged semiconductor chips and press the second Peltier devices into the second packaged semiconductor chips.

14. The data center of claim 13, wherein the first Peltier devices are located in grooves formed in the first outer surface.

15. The data center of claim 13, wherein respective wires for the first and second Peltier devices are mechanically integrated with the first and second outer surfaces.

16. The data center of claim 15, wherein the respective wires run to at least one electrical connector that is mechanically integrated with the cold plate and is connected to a PC board that the first and second DIMMs are installed upon.

17. The data center of claim 15, wherein an elastic epoxy resides between the respective wires and the first and second outer surfaces.

18. The data center of claim 13, wherein the first and second DIMMs conform to a Joint Electronic Device Engineering Council (JEDEC) Double Data Rate (DDR) standard.

19. An apparatus, comprising:
- a cold plate to be inserted between first and second Dual In-Line Memory Modules (DIMMs) when the first and second DIMMs are plugged into respective first and second DIMM connectors, the cold plate having a first outer surface to face the first DIMM, the first outer surface having a first active device to be placed in thermal contact with the first DIMM, the cold plate having a second outer surface to face the second DIMM, the second outer surface having a second active device to be placed in thermal contact with the second DIMM, the cold plate to hold liquid that is to receive heat generated from the first and second DIMMs;
- electrical connections emanating from the cold plate, the electrical connections to be coupled to an electrical connector that resides between the first and second DIMM connectors; and
- electrical wiring that is integrated with the cold plate and that runs between the electrical connections to the first and second active devices.

* * * * *